United States Patent
Fujimoto et al.

(10) Patent No.: US 7,622,925 B2
(45) Date of Patent: Nov. 24, 2009

(54) PARALLEL MR IMAGING METHOD WITH MRI MULTI-TURN COILS HAVING DIFFERENT PITCH/SENSITIVITY DISTRIBUTIONS

(75) Inventors: Masahiro Fujimoto, Tokyo (JP); Kenji Sato, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/107,531

(22) Filed: Apr. 15, 2005

(65) Prior Publication Data

US 2005/0231201 A1  Oct. 20, 2005

(30) Foreign Application Priority Data

Apr. 16, 2004 (JP) ............... 2004-121057

(51) Int. Cl.
*G01V 3/00* (2006.01)
(52) U.S. Cl. ............................ 324/318; 324/309
(58) Field of Classification Search ......... 324/300–322; 600/410, 411, 420, 422
See application file for complete search history.

(56) References Cited

U.S. PATENT DOCUMENTS

| | | | | |
|---|---|---|---|---|
| 4,310,799 A | * | 1/1982 | Hutchison et al. | 324/319 |
| 4,486,711 A | * | 12/1984 | Frese et al. | 324/319 |
| 4,996,481 A | * | 2/1991 | Ackerman et al. | 324/318 |
| 5,041,791 A | * | 8/1991 | Ackerman et al. | 324/318 |
| 5,198,769 A | * | 3/1993 | Frese et al. | 324/318 |
| 5,532,595 A | * | 7/1996 | Lampman et al. | 324/309 |
| 5,565,778 A | * | 10/1996 | Brey et al. | 324/318 |
| 5,594,342 A | * | 1/1997 | Brey et al. | 324/322 |
| 5,619,140 A | * | 4/1997 | Brey et al. | 324/318 |
| 5,646,530 A | | 7/1997 | Strenk et al. | |
| 5,661,401 A | * | 8/1997 | Ishikawa et al. | 324/320 |
| 5,689,188 A | * | 11/1997 | Claasen-Vujcic | 324/318 |
| 5,708,362 A | * | 1/1998 | Frese et al. | 324/319 |
| 5,760,583 A | | 6/1998 | Sato et al. | |
| 5,818,232 A | | 10/1998 | Mehr et al. | |
| 6,348,794 B1 | | 2/2002 | Nabetani et al. | |
| 6,510,035 B2 | | 1/2003 | Sato | |
| 6,580,274 B2 | | 6/2003 | Sato | |
| 6,650,117 B2 | | 11/2003 | Hoshino et al. | |

(Continued)

FOREIGN PATENT DOCUMENTS

JP  2001-128956  5/2001

(Continued)

OTHER PUBLICATIONS

Tsutomu Araki and Kazuro Sugimura, "Partial-Fourier Single Shot Fast Spin Echo, Half-Fourier Single Shot Fast Spin Echo", Dictionary of MRI, CT Terms, Japan, Medical View Col, Ltd., Nov. 10, 2000, p. 120.

*Primary Examiner*—Brij B. Shrivastav
*Assistant Examiner*—Tiffany A Fetzner
(74) *Attorney, Agent, or Firm*—Armstrong Teasdale LLP (57) ABSTRACT

An MRI coil capable of improving an SNR (signal-to-noise ratio) includes a pair of multi-turn coils disposed to face each other in an x-direction across a space for accommodating a subject, and the center of turns of the first multi-turn coil is biased in a (−y)-direction, and the center of turns of the second multi-turn coil is biased in a (+y)-direction.

10 Claims, 4 Drawing Sheets

U.S. PATENT DOCUMENTS

| | | | |
|---|---|---|---|
| 6,700,378 B2 | 3/2004 | Sato | |
| 6,727,700 B2* | 4/2004 | Marek | 324/318 |
| 6,750,654 B2 | 6/2004 | Sato | |
| 6,806,713 B2* | 10/2004 | Wong | 324/318 |
| 6,975,115 B1* | 12/2005 | Fujita et al. | 324/318 |
| 7,026,818 B2* | 4/2006 | Machida et al. | 324/322 |
| 7,061,242 B2* | 6/2006 | Ochi et al. | 324/318 |
| 7,176,689 B2* | 2/2007 | Machida et al. | 324/318 |
| 7,221,161 B2* | 5/2007 | Fujita et al. | 324/318 |
| 2002/0190715 A1* | 12/2002 | Marek | 324/318 |
| 2003/0132750 A1* | 7/2003 | Machida et al. | 324/318 |
| 2004/0061498 A1* | 4/2004 | Ochi et al. | 324/318 |
| 2004/0070398 A1* | 4/2004 | Wong | 324/322 |
| 2004/0196042 A1* | 10/2004 | Fujita et al. | 324/318 |
| 2005/0231201 A1* | 10/2005 | Fujimoto et al. | 324/318 |
| 2009/0160441 A1* | 6/2009 | Dohata et al. | 324/318 |

FOREIGN PATENT DOCUMENTS

| | | |
|---|---|---|
| JP | 2003-079595 | 3/2003 |
| JP | 2003-159229 | 6/2003 |

* cited by examiner

PARALLEL MR IMAGING METHOD WITH MRI MULTI-TURN COILS HAVING DIFFERENT PITCH/SENSITIVITY DISTRIBUTIONS

CROSS REFERENCE TO RELATED APPLICATIONS

This application claims the benefit of Japanese Application No. 2004-121057 filed Apr. 16, 2004.

BACKGROUND OF THE INVENTION

The present invention relates to an MR (magnetic resonance) imaging method and an MRI (magnetic resonance imaging) coil, and more particularly to an MR imaging method and an MRI coil capable of improving an SNR (signal-to-noise ratio).

There has heretofore been proposed a technique of conducting parallel MRI with a plurality of coils having significantly different sensitivity distributions from one to another disposed in the phase encoding direction (for example, see Patent Document 1). The parallel MRI is a technique for producing an MR image by receiving signals from a subject by a plurality of coils and processing them in parallel for reducing the imaging time.

Moreover, the SNR in a SENSE (sensitivity encoding) technique is known to be inversely proportional to a g factor (geometry factor) (for example, see Non-patent Document 1). The SENSE technique, which is one type of parallel MRI, is a technique of decimating the phase encoding steps, instead of receiving signals by a plurality of coils in parallel, for reducing the imaging time. The "g factor" is a value determined by the position of coils and the SENSE algorithm.

[Patent Document 1] Japanese Patent Application Laid Open No. 2003-79595 ([0009]).

[Non-patent Document 1] "Getting a Good Command of MRI" (Japanese original title: "MRI Ouyou Jizai"), edited by Jun'ichi Hachiya and another, published by Medical Review Co., Ltd., (Nov. 10, 2001), pp. 9-10.

Such conventional parallel MRI and SENSE techniques employ a pair of single-turn coils (a single-turn coil is a coil whose number of turns is one) that are disposed to face each other across a space for accommodating a subject.

The single-turn coil, however, does not have high sensitivity in close proximity to its coil plane, and hence, the rate of change in sensitivity is not high in the face-to-face direction and the g factor is increased, leading to a problem that a sufficiently high SNR cannot be obtained.

SUMMARY OF THE INVENTION

It is therefore an object of the present invention to provide an MR imaging method and an MRI coil capable of improving the SNR.

In its first aspect, the present invention provides an MR imaging method characterized in comprising: employing an MRI coil having a pair of coils disposed to face each other across a space for accommodating a subject, at least one of said coils being a multi-turn coil.

According to the MR imaging method of the first aspect, since a multi-turn coil (a coil whose number of turns is two or more) is employed, sensitivity in close proximity to the coil plane is raised relative to that of the single-turn coil. Thus, the rate of change in sensitivity is increased in the face-to-face direction and the g factor is decreased, resulting in a sufficiently high SNR being obtained in an FOV.

In its second aspect, the present invention provides an MR imaging method characterized in comprising: employing a pair of multi-turn coils disposed to face each other across a space for accommodating a subject, said pair of multi-turn coils having at least one of the number of turns and the pitch differentiated between the coils.

According to the MR imaging method of second aspect, since a pair of multi-turn coils are employed, sensitivity in close proximity to the coil plane is raised relative to that of the single-turn coil. Thus, the rate of change in sensitivity is increased in the face-to-face direction and the g factor is decreased, resulting in a sufficiently high SNR being obtained in an FOV in the face-to-face direction.

Moreover, the single-turn coil has a sensitivity distribution symmetric in a direction parallel to the coil plane, and has a problem that the phase encoding direction cannot be defined as the direction parallel to the coil plane; on the other hand, in the MR imaging method of the second aspect, since the pair of multi-turn coils have at least one of the number of turns and the pitch differentiated between the coils, the sensitivity distribution becomes asymmetric in the direction parallel to the coil plane, and it is possible to define the phase encoding direction as the direction parallel to the coil plane. In other words, it is possible to define an FOV parallel to the coil plane.

In its third aspect, the present invention provides the MR imaging method having the aforementioned configuration, characterized in that: a phase encoding direction is defined as the face-to-face direction.

According to the MR imaging method of third aspect, since the phase encoding direction is defined as the face-to-face direction of the coils as in the conventional techniques, the conventional imaging algorithm can be employed as is.

In its fourth aspect, the present invention provides the MR imaging method having the aforementioned configuration, characterized in that: phase encoding steps are decimated.

According to the MR imaging method of the fourth aspect, the time needed for MR imaging on an FOV parallel to the face-to-face direction can be reduced.

In its fifth aspect, the present invention provides the MR imaging method having the aforementioned configuration, characterized in that: a phase encoding direction is defined as a direction parallel to the coil plane.

According to the MR imaging method of the fifth aspect, an FOV parallel to the coil plane can be defined.

In its sixth aspect, the present invention provides the MR imaging method having the aforementioned configuration, characterized in that: phase encoding steps are decimated.

According to the MR imaging method of the sixth aspect, the time needed for MR imaging on an FOV parallel to the coil plane can be reduced.

In its seventh aspect, the present invention provides an MR imaging method characterized in comprising: employing an MRI coil having a plurality of coils disposed at different angular positions on an outer periphery of a bobbin surrounding a space for accommodating a subject, at least one of said coils being a multi-turn coil.

According to the MR imaging method of the seventh aspect, since a multi-turn coil is employed, sensitivity in close proximity to the coil plane is raised relative to that of the single-turn coil. Thus, the rate of change in sensitivity is increased in the radial direction of the bobbin and the g factor is decreased, resulting in a sufficiently high SNR being obtained in an FOV in the radial direction of the bobbin.

In its eighth aspect, the present invention provides an MR imaging method characterized in comprising: employing an MRI coil having a plurality of multi-turn coils disposed at different angular positions on an outer periphery of a bobbin surrounding a space for accommodating a subject, said plurality of multi-turn coils having at least one of the number of turns and the pitch differentiated between the coils at adjacent angular positions.

According to the MR imaging method of the eighth aspect, since multi-turn coils are employed, sensitivity in close proximity to the coil plane is raised relative to that of the single-turn coil. Thus, the rate of change in sensitivity is increased in the radial direction of the bobbin and the g factor is decreased, resulting in a sufficiently high SNR being obtained in an FOV in the radial direction of the bobbin.

Moreover, the single-turn coil has a sensitivity distribution symmetric in a direction along the center axis of the bobbin, and has a problem that the phase encoding direction cannot be defined as the direction along the center axis of the bobbin; on the other hand, in the MR imaging method of the eighth aspect, since the multi-turn coils have at least one of the number of turns and the pitch differentiated between the coils, the sensitivity distribution becomes asymmetric in the direction along the center axis of the bobbin, and it is possible to define the phase encoding direction as the direction along the center axis of the bobbin. In other words, it is possible to define an FOV parallel to the direction along the center axis of the bobbin.

In its ninth aspect, the present invention provides an MRI imaging method characterized in comprising: employing an MRI coil having a plurality of coils disposed side by side along a space for accommodating a subject, at least one of said coils being a multi-turn coil.

If a plurality of coils are disposed side by side along a space for accommodating a subject, the phase encoding direction may be defined as the side-by-side direction of the coils. However, since a single-turn coil does not have a high sensitivity in close proximity to the coil plane, the rate of change in sensitivity is low in the side-by-side direction and the g factor is large, thus leading to a problem that a sufficiently high SNR cannot be obtained.

On the contrary, according to the MR imaging method of the ninth aspect, a multi-turn coil employed provides a higher sensitivity in close proximity to the coil plane than that of the single-turn coil. Therefore, the rate of change in sensitivity is increased in the side-by-side direction and the g factor is decreased, resulting in a sufficiently high SNR being obtained in an FOV in the side-by-side direction.

In its tenth aspect, the present invention provides an MRI imaging method characterized in comprising: employing an MRI coil having on one side of a pair of planes facing each other across a space for accommodating a subject a plurality of multi-turn coils disposed side by side, and also on the other side a plurality of multi-turn coils disposed side by side, opposite ones of said multi-turn coils having at least one of the number of turns and the pitch differentiated between the coils, and adjacent ones of said multi-turn coils having the same number of turns and the same pitch or having at least one of the number of turns and the pitch differentiated between the coils.

According to the MR imaging method of the tenth aspect, since multi-turn coils are employed, sensitivity in close proximity to the coil plane is raised relative to that of the single-turn coil. Thus, the rate of change in sensitivity is increased in the face-to-face direction and the g factor is decreased, resulting in a sufficiently high SNR being obtained in an FOV in the face-to-face direction.

Moreover, since the multi-turn coils are disposed side by side, the rate of change in sensitivity is increased in the side-by-side direction and the g factor is decreased, resulting in a sufficiently high SNR being obtained also in an FOV in the side-by-side direction.

In its eleventh aspect, the present invention provides an MRI coil characterized in comprising: a pair of coils disposed to face each other across a space for accommodating a subject, at least one of said coils being a multi-turn coil.

By using the MRI according to the eleventh aspect, the MR imaging method of the first aspect can be suitably implemented.

In its twelfth aspect, the present invention provides an MRI coil characterized in comprising: a pair of coils disposed to face each other across a space for accommodating a subject, said coils being multi-turn coils, and having at least one of the number of turns and the pitch differentiated between the coils.

By using the MRI according to the twelfth aspect, the MR imaging method of the second aspect can be suitably implemented.

In its thirteenth aspect, the present invention provides an MRI coil characterized in comprising: a plurality of coils disposed at different angular positions on an outer periphery of a bobbin surrounding a space for accommodating a subject, at least one of said coils being a multi-turn coil.

By using the MRI according to the thirteenth aspect, the MR imaging method of the seventh aspect can be suitably implemented.

In its fourteenth aspect, the present invention provides an MRI coil characterized in comprising: a plurality of multi-turn coils disposed at different angular positions on an outer periphery of a bobbin surrounding a space for accommodating a subject, said plurality of multi-turn coils having at least one of the number of turns and the pitch differentiated between the coils at adjacent angular positions.

By using the MRI according to the fourteenth aspect, the MR imaging method of the eighth aspect can be suitably implemented.

In its fifteenth aspect, the present invention provides an MRI coil characterized in comprising: a plurality of coils disposed side by side along a space for accommodating a subject, at least one of said coils being a multi-turn coil.

By using the MRI according to the fifteenth aspect, the MR imaging method of the ninth aspect can be suitably implemented.

In its sixteenth aspect, the present invention provides an MRI coil characterized in comprising: on one side of a pair of planes facing each other across a space for accommodating a subject, a plurality of multi-turn coils disposed side by side, and also on the other side, a plurality of multi-turn coils disposed side by side, opposite ones of said multi-turn coils having at least one of the number of turns and the pitch differentiated between the coils, and adjacent ones of said multi-turn coils having the same number of turns and the same pitch or having at least one of the number of turns and the pitch differentiated between the coils.

By using the MRI according to the sixteenth aspect, the MR imaging method of the tenth aspect can be suitably implemented.

According to the MR imaging method and MRI coil of the present invention, since the multi-turn coil is employed, sensitivity in close proximity to the coil plane is raised and the g factor is decreased, resulting in a sufficiently high SNR being obtained.

The MRI coil of the present invention can be applied to MR imaging in which a shorter imaging time is preferred (e.g., imaging on heart, lungs, liver or pancreas, vascular imaging on peripheral blood vessels, or contrast-enhanced imaging).

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to examples shown in the accompanying drawings. It should be noted that the present invention is not limited to these examples.

Example 1

Figure 1A:
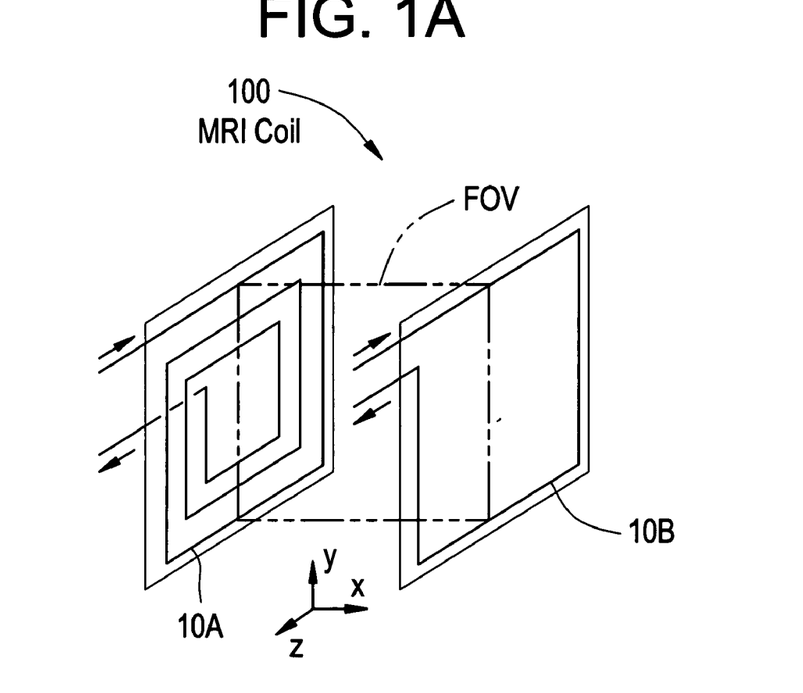
FIGS. 1a and 1b include a perspective view and a sensitivity distribution profile of an MRI coil in accordance with Example 1.

FIG. 1(a) is a perspective view showing an MRI coil 100 in accordance with Example 1.

The MRI coil 100 comprises a pair of coils disposed to face each other in an x-direction across a space for accommodating a subject, one of the coils being a multi-turn coil 10A, and the other being a single-turn coil 10B.

The multi-turn coil 10A and single-turn coil 10B have their respective coil planes along the yz-plane.

Figure 1B:
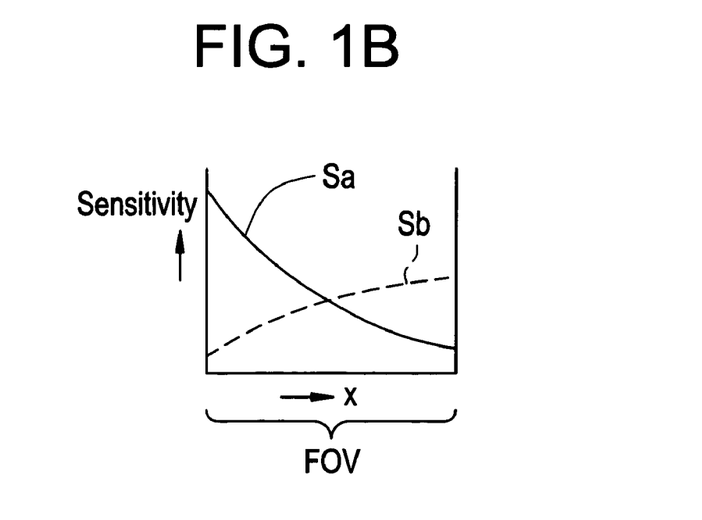

FIG. 1(b) is a sensitivity distribution profile of the multi-turn coil 10A and single-turn coil 10B in the x-direction.

The sensitivity distribution Sa of the multi-turn coil 10A has higher sensitivity in close proximity to the coil plane. It also exhibits a higher rate of change in sensitivity in the face-to-face direction. The g factor is thus decreased and a sufficiently high SNR can be obtained for an FOV in the face-to-face direction.

The sensitivity distribution Sb of the single-turn coil 10B has lower sensitivity in close proximity to the coil plane. It also exhibits a lower rate of change in sensitivity in the face-to-face direction. The g factor is thus increased and a sufficiently high SNR cannot be obtained for an FOV in the face-to-face direction. However, the single-turn coil B has a simpler structure.

Thus, the parallel MRI or SENSE technique can be conducted on an FOV parallel to the face-to-face direction (x-direction) as shown in FIG. 1(a) with the phase encoding direction defined as the face-to-face direction. Moreover, the imaging time can be reduced by decimating the phase encoding step.

By using the MRI coil 100 of Example 1 to conduct MR imaging according to the parallel MRI or SENSE technique, the SNR can be improved.

Example 2

Figure 2A:
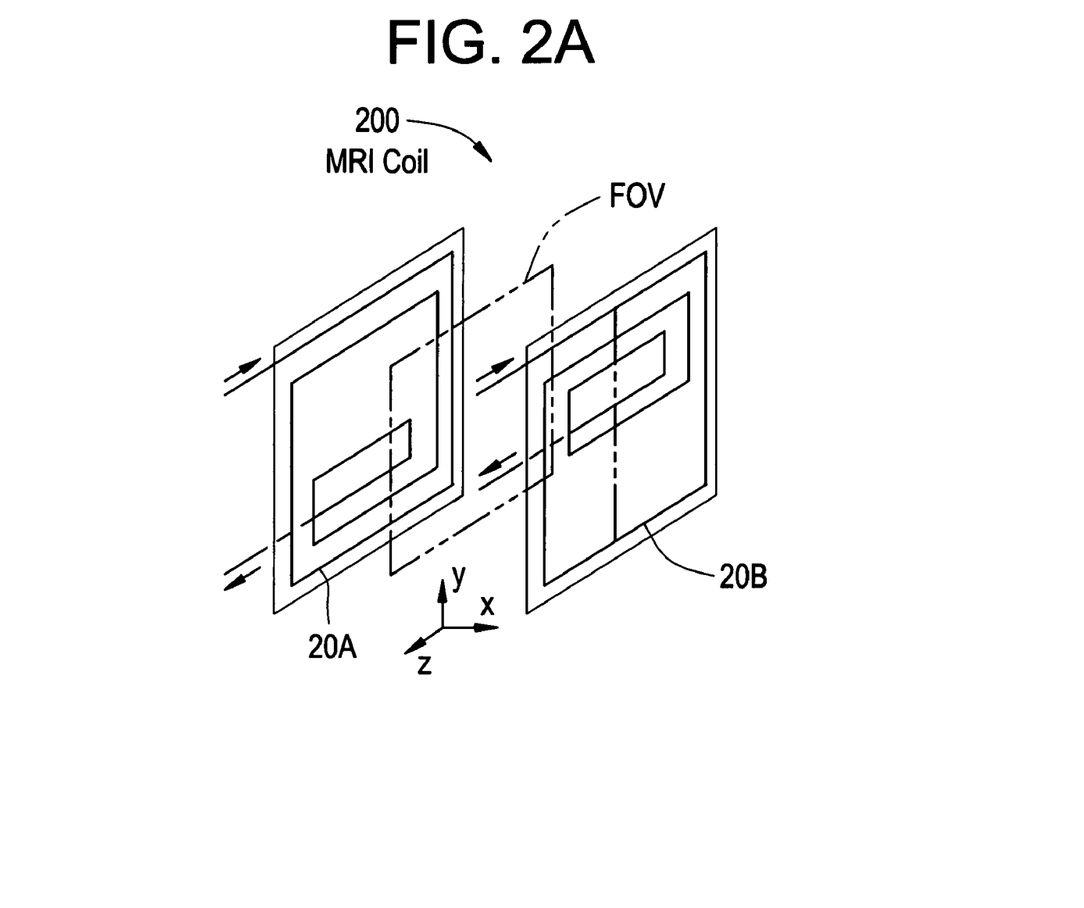
FIGS. 2a and 2b include a perspective view and a sensitivity distribution profile of an MRI coil in accordance with Example 2.

FIG. 2(a) is a perspective view showing an MRI coil 200 in accordance with Example 2.

The MRI coil 200 comprises a pair of multi-turn coils 20A and 20B disposed to face each other in the x-direction across a space for accommodating the subject.

The multi-turn coils 20A and 20B have their respective coil planes along the yz-plane.

The multi-turn coils 20A and 20B have different coil pitches in the y-direction. Specifically, the center of turns of the multi-turn coil 20A is biased in the (−y)-direction, while the center of turns of the multi-turn coil 20B is biased in the (+y)-direction.

Figure 2B:
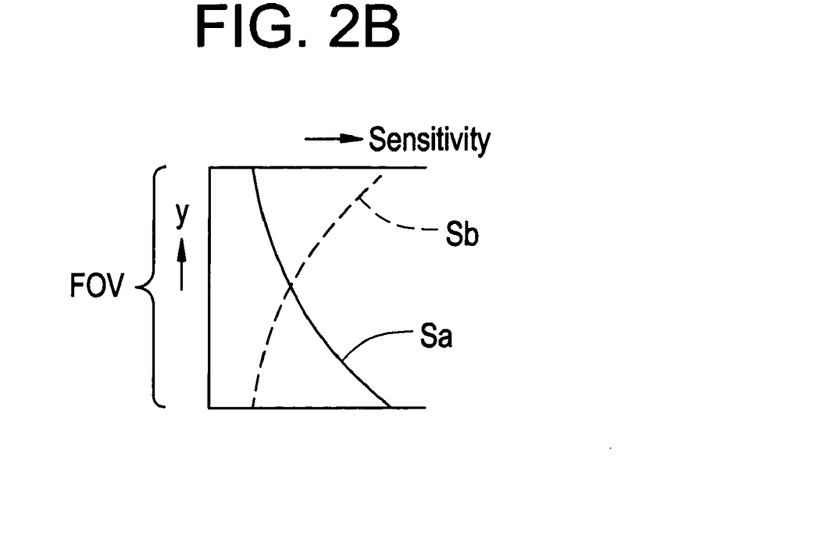

FIG. 2(b) is a sensitivity distribution profile of the multi-turn coils 20A and 20B in the y-direction.

The sensitivity distribution Sa of the multi-turn coil 20A is higher in the (−y)-direction, and lowers toward the (+y)-direction. On the contrary, the sensitivity distribution Sb of the multi-turn coil 20B is higher in the (+y)-direction, and lowers toward the (−y)-direction.

Thus, the parallel MRI or SENSE technique can be conducted on an FOV parallel to the y-direction as shown in FIG. 2(a) with the phase encoding direction defined as the y-direction. Moreover, imaging time can be reduced by decimating the phase encoding step.

The parallel MRI or SENSE technique may also be conducted on an FOV parallel to the face-to-face direction with the phase encoding direction defined as the face-to-face direction, as in Example 1. Moreover, imaging time can be reduced by decimating the phase encoding step.

By using the MRI coil 200 of Example 2 to conduct MR imaging according to the parallel MRI or SENSE technique, the SNR can be improved.

Example 3

Figure 3:
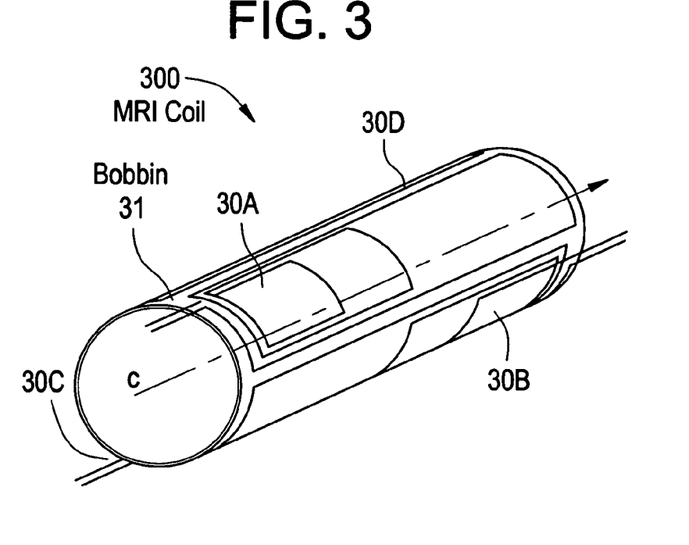
FIG. 3 is a perspective view of an MRI coil in accordance with Example 3.

FIG. 3 is a perspective view showing an MRI coil 300 in accordance with Example 3.

The MRI coil 300 comprises four multi-turn coils 30A, 30B, 30C and 30D disposed at angular positions different by 90° on an outer periphery of a cylindrical bobbin 31 surrounding a space for accommodating a subject.

Figure 4:
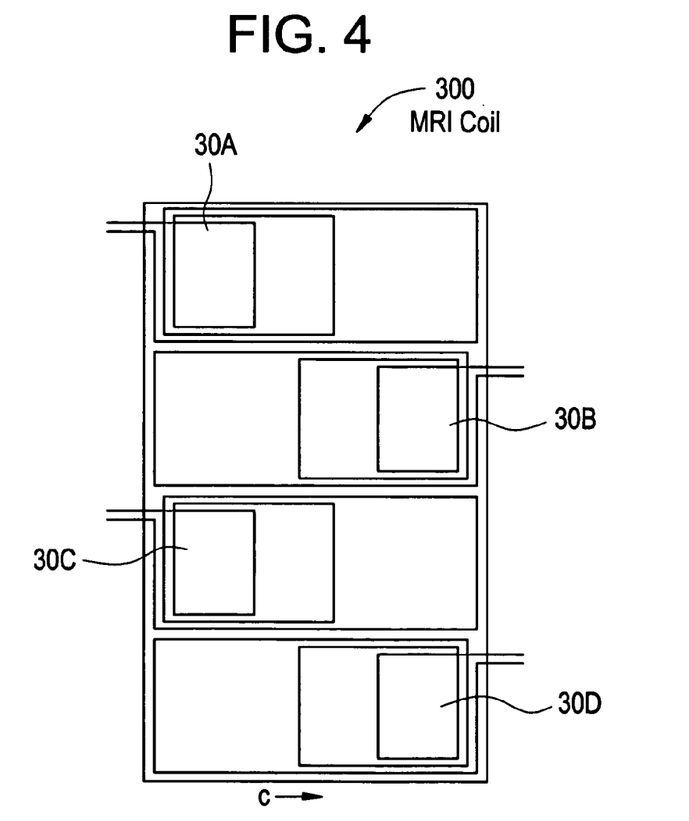
FIG. 4 is an exploded diagram of the MRI coil in accordance with Example 3.

FIG. 4 is an exploded view of the MRI coil 300.

The multi-turn coils 30A-30D have respective coil pitches in a direction along the center axis of the bobbin (c-direction), the coil pitch being differentiated between adjacent coils. Specifically, the centers of turns of the multi-turn coils 30A and 30C are biased leftward of FIG. 4, and the centers of turns of the multi-turn coil 30B and 30D are biased rightward of FIG. 4.

Therefore, the sensitivity distribution of the multi-turn coils 30A and 30C is higher on the left side of FIG. 4, and lowers toward the right side. On the contrary, the sensitivity distribution of the multi-turn coils 30B and 30D is higher on the right side of FIG. 4, and lowers toward the left side.

Thus, the parallel MRI or SENSE can be conducted on an FOV parallel to the c-direction with the phase encoding direction defined as the c-direction. Moreover, imaging time can be reduced by decimating the phase encoding step.

The parallel MRI or SENSE technique may also be conducted on an FOV parallel to the radial direction with the phase encoding direction defined as the face-to-face direction of the multi-turn coils 30A and 30C or of the multi-turn coil 30B and 30D, as in Example 1. Moreover, the imaging time can be reduced by decimating the phase encoding step.

By using the MRI coil 300 of Example 3 to conduct MR imaging according to the parallel MRI or SENSE technique, the SNR can be improved.

Example 4

Figure 5:
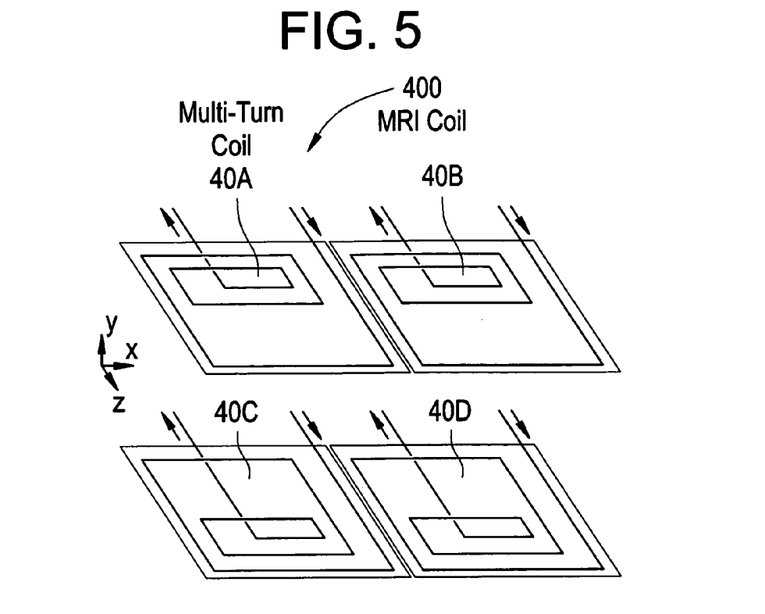
FIG. 5 is a perspective view of an MRI coil in accordance with Example 4.

FIG. 5 is a perspective view showing an MRI coil 400 in accordance with Example 4.

The MRI coil 400 comprises multi-turn coils 40A and 40B disposed side by side in one plane of a pair of planes that face each other across a space for accommodating a subject, and multi-turn coils 40C and 40D disposed side by side in the other of the planes.

The multi-turn coils 40A-40D have their respective coil planes along the xz-plane.

The multi-turn coils 40A and 40B are adjacent to each other in the x-direction.

The multi-turn coils 40C and 40D are adjacent to each other in the x-direction.

The multi-turn coils 40A and 40B and the multi-turn coils 40C and 40D face each other, respectively, in the y-direction.

The multi-turn coils 40A and 40C facing each other have different coil pitches in the z-direction. Specifically, the center of turns of the multi-turn coil 40A is biased in the (−z)-direction, while the center of turns of the multi-turn coil 40C is biased in the (+z)-direction.

Likewise, the multi-turn coils 40B and 40D facing each other have different coil pitches in the z-direction. Specifically, the center of turns of the multi-turn coil 40B is biased in the (−z)-direction, while the center of turns of the multi-turn coil 40D is biased in the (+z)-direction.

Thus, the parallel MRI or SENSE technique can be conducted on an FOV parallel to the z-direction with the phase encoding direction defined as the z-direction. Moreover, the imaging time can be reduced by decimating the phase encoding step.

The parallel MRI or SENSE technique may also be conducted on an FOV parallel to the face-to-face direction (y-direction) with the phase encoding direction defined as the face-to-face direction, as in Example 1. Moreover, the imaging time can be reduced by decimating the phase encoding step.

Moreover, the parallel MRI or SENSE technique may be conducted on an FOV parallel to the side-by-side direction (x-direction) with the phase encoding direction defined as the side-by-side direction. Moreover, the imaging time can be reduced by decimating the phase encoding step.

By using the MRI coil 400 of Example 4 to conduct MR imaging according to the parallel MRI or SENSE technique, the SNR can be improved.

Example 5

Figure 6:
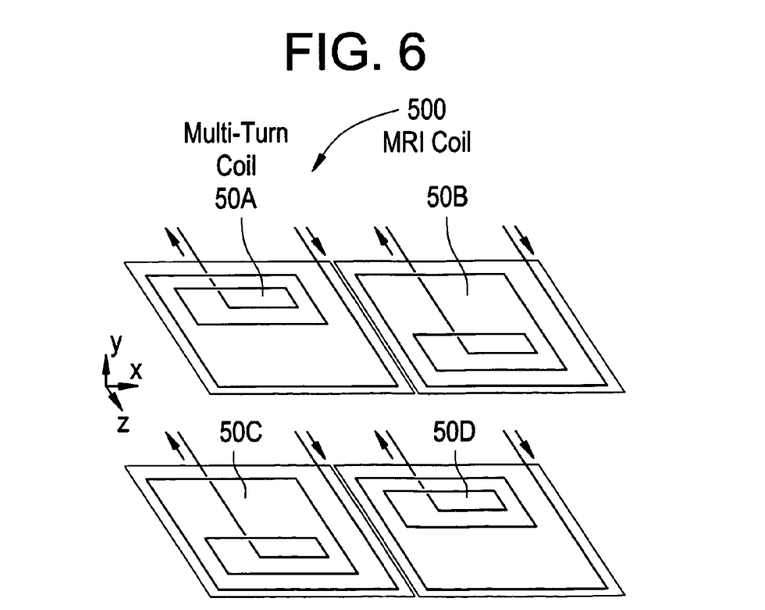
FIG. 6 is a perspective view of an MRI coil in accordance with Example 5.

FIG. 6 is a perspective view showing an MRI coil 500 in accordance with Example 5.

The MRI coil 500 comprises multi-turn coils 50A and 50B disposed side by side in one plane of a pair of planes that face each other across a space for accommodating a subject, and multi-turn coils 50C and 50D disposed side by side in the other of the planes.

The multi-turn coils 50A-50D have their respective coil planes along the xz-plane.

The multi-turn coils 50A and 50B are adjacent to each other in the x-direction.

The multi-turn coils 50C and 50D are adjacent to each other in the x-direction.

The multi-turn coils 50A and 50B and the multi-turn coils 50C and 50D face each other, respectively, in the y-direction.

The multi-turn coils 50A and 50C facing each other have different coil pitches in the z-direction. Specifically, the center of turns of the multi-turn coil 50A is biased in the (−z)-direction, while the center of turns of the multi-turn coil 50C is biased in the (+z)-direction.

Likewise, the multi-turn coils 50B and 50D facing each other have different coil pitches in the z-direction. Specifically, the center of turns of the multi-turn coil 50B is biased in the (+z)-direction, while the center of turns of the multi-turn coil 50D is biased in the (−z)-direction.

Therefore, the adjacent multi-turn coils 50A and 50B have different coil pitches in the z-direction. Similarly, the adjacent multi-turn coils 50C and 50D have different coil pitches in the z-direction.

Thus, the parallel MRI or SENSE technique can be conducted on an FOV parallel to the z-direction with the phase encoding direction defined as the z-direction. Moreover, imaging time can be reduced by decimating the phase encoding step.

The parallel MRI or SENSE technique may also be conducted on an FOV parallel to the face-to-face direction (y-direction) with the phase encoding direction defined as the face-to-face direction, as in Example 1. Moreover, the imaging time can be reduced by decimating the phase encoding step.

Moreover, the parallel MRI or SENSE technique may be conducted on an FOV parallel to the side-by-side direction (x-direction) with the phase encoding direction defined as the side-by-side direction. Moreover, the imaging time can be reduced by decimating the phase encoding step.

By using the MRI coil 500 of Example 5 to conduct MR imaging according to the parallel MRI or SENSE technique, the SNR can be improved.

Example 6

While a desired sensitivity distribution is obtained by differentiating the coil pitch in Examples 2-5, it may instead be obtained by differentiating the number of turns instead of or in addition to differentiating the coil pitch.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MRI coil system comprising: a pair of multi-turn coils disposed to face each other in an x-direction across a space for accommodating a subject, said pair of multi-turn coils having at least one of a number of turns and a pitch differentiated between said pair of multi-turn coils, wherein said pair of multi-turn coils have different sensitivity distributions disposed in a phase encoding direction substantially perpendicular to said x-direction and are configured to conduct parallel magnetic resonance imaging, wherein at least one field of view of said MRI coil system is substantially perpendicular to said x-direction, a first multi-turn coil of said pair of multi-turn coils has a sensitivity distribution increasing in a (−y)-direction, and a second multi-turn coil of said pair of multi-turn coils has a sensitivity distribution increasing in the (+y)-direction, the second multi-turn coil being substantially an inverted mirror image of the first multi-turn coil, wherein the first multi-turn coil receives a first signal at a location proximate a first end of the first multi-turn coil toward the (+y)-direction adjacent to a first end of the second multi-turn coil toward the (+y)-direction, the second multi-turn coil receives a second signal at a location proximate the first end of the second multi-turn coil, and the second multi-turn coil outputs the second signal at a location between the location at which the first signal of the first multi-turn coil is received and a location at which an output signal of the first multi-turn coil is outputted.

2. An MR imaging method comprising the step of: employing a first multi-turn coil and a second multi-turn coil disposed to face each other in an x-direction across a space for accommodating a subject, the first multi-turn coil and the second multi-turn coil having at least one of a number of turns and a pitch differentiated between the first multi-turn coil and the second multi-turn coil, the second multi-turn coil being substantially an inverted mirror image of the first multi-turn coil, wherein the first multi-turn coil has a first sensitivity distribution in a (−y)-direction substantially perpendicular to the x-direction, a sensitivity of the first multi-turn coil decreases toward a (+y)-direction, and a second sensitivity distribution of the second multi-turn has a second sensitivity that increases in the (+y)-direction, wherein the first multi-turn coil receives a first signal at a location proximate a first end of the first multi-turn coil toward the (+y)-direction adjacent to a first end of the second multi-turn coil toward the (+y)-direction, the second multi-turn coil receives a second signal at a location proximate the first end of the second multi-turn coil, and the second multi-turn coil outputs the second signal at a location between the location at which the first signal of the first multi-turn coil is received and a location at which an output signal of the first multi-turn coil is outputted, the first multi-turn coil and the second multi-turn coil are configured to conduct parallel magnetic resonance imaging, and wherein at least one field of view of the MRI coil is substantially perpendicular to the x-direction.

3. An MRI coil system comprising: a pair of multi-turn coils disposed to face each other in an x-direction across a space for accommodating a subject, wherein said pair of multi-turn coils have different sensitivity distributions disposed in a phase encoding direction substantially perpendicular to said x-direction and are configured to conduct parallel magnetic resonance imaging, wherein at least one field of view of said MRI coil system is substantially perpendicular to said x-direction, a first multi-turn coil of the pair of multi-turn coils has a sensitivity distribution increasing in a (−y)-direction, and a second multi-turn coil of the pair of multi-turn coils has a sensitivity distribution increasing in the (+y)-direction, the second multi-turn coil being substantially an inverted mirror image of the first multi-turn coil, wherein the first multi-turn coil receives a first signal at a location proximate a first end of the first multi-turn coil toward the (+y)-direction adjacent to a first end of the second multi-turn coil toward the (+y)-direction, the second multi-turn coil receives a second signal at a location proximate the first end of the second multi-turn coil, and the second multi-turn coil outputs the second signal at a location between the location at which the first signal of the first multi-turn coil is received and a location at which an output signal of the first multi-turn coil is outputted.

4. An MRI coil system in accordance with claim 3, wherein said coils are configured to conduct a sensitivity encoding technique.

5. An MRI coil system in accordance with claim 3, wherein each turn of said multi-turn coils comprises a loop, and each loop of said multi-turn coils comprises a plane located parallel to a longitudinal axis of an imaging space, wherein a first loop of said multi-turn coils is substantially concentrically aligned with a second loop of said multi-turn coils.

6. An MRI coil system in accordance with claim 3, wherein said coils are configured to process a signal from each coil in parallel to reduce an image reconstruction time.

7. An MRI coil system in accordance with claim 3, wherein each coil has a different configuration.

8. An MRI coil system in accordance with claim 3, wherein the pair of coils are configured to decimate phase encoding steps.

9. An MRI coil system in accordance with claim 3, wherein a g-factor is determined by a position of the pair of coils.

10. An MRI coil system in accordance with claim 3, wherein a g-factor is determined by a SENSE algorithm.

* * * * *